US008968588B2

(12) United States Patent
Zhao et al.

(10) Patent No.: US 8,968,588 B2
(45) Date of Patent: Mar. 3, 2015

(54) LOW ELECTRON TEMPERATURE MICROWAVE SURFACE-WAVE PLASMA (SWP) PROCESSING METHOD AND APPARATUS

(75) Inventors: Jianping Zhao, Austin, TX (US); Lee Chen, Cedar Creek, TX (US); Vincent M. Donnelly, Houston, TX (US); Demetre J. Economou, Houston, TX (US); Merritt Funk, Austin, TX (US); Radha Sundararajan, Dripping Springs, TX (US)

(73) Assignee: Tokyo Electron Limited, Tokyo (JP)

( * ) Notice: Subject to any disclaimer, the term of this patent is extended or adjusted under 35 U.S.C. 154(b) by 43 days.

(21) Appl. No.: 13/436,458

(22) Filed: Mar. 30, 2012

(65) Prior Publication Data

US 2013/0256272 A1 Oct. 3, 2013

(51) Int. Cl.
| | |
|---|---|
| H01L 21/302 | (2006.01) |
| H01L 21/461 | (2006.01) |
| B44C 1/22 | (2006.01) |
| C03C 15/00 | (2006.01) |
| C03C 25/68 | (2006.01) |
| C23F 1/00 | (2006.01) |

(52) U.S. Cl.
USPC ............... 216/69; 216/67; 438/689; 438/706; 438/710; 438/714

(58) Field of Classification Search
None
See application file for complete search history.

(56) References Cited

U.S. PATENT DOCUMENTS

| | | | |
|---|---|---|---|
| 7,268,084 B2 | 9/2007 | Chen et al. | |
| 7,396,431 B2 | 7/2008 | Chen et al. | |
| 7,713,758 B2 | 5/2010 | Yamashita et al. | |
| 7,765,077 B2 | 7/2010 | Yamashita et al. | |
| 7,858,270 B2 | 12/2010 | Stamper | |
| 7,894,927 B2 | 2/2011 | Funk et al. | |
| 7,899,637 B2 | 3/2011 | Yamashita et al. | |
| 2004/0238490 A1* | 12/2004 | Sumiya et al. | 216/67 |
| 2005/0022839 A1* | 2/2005 | Savas et al. | 134/1.2 |
| 2006/0065367 A1* | 3/2006 | Chen et al. | 156/345.33 |
| 2006/0065621 A1 | 3/2006 | Chen et al. | |
| 2006/0065629 A1 | 3/2006 | Chen et al. | |
| 2008/0060759 A1 | 3/2008 | Chen et al. | |
| 2008/0292973 A1 | 11/2008 | Stamper | |
| 2008/0311687 A1 | 12/2008 | Yamashita et al. | |
| 2008/0311688 A1 | 12/2008 | Yamashita et al. | |
| 2009/0023296 A1 | 1/2009 | Nishizuka | |
| 2009/0081815 A1 | 3/2009 | Yamashita et al. | |
| 2009/0082983 A1 | 3/2009 | Yamashita et al. | |
| 2009/0197420 A1 | 8/2009 | Luong et al. | |
| 2009/0242513 A1 | 10/2009 | Funk et al. | |
| 2010/0036514 A1 | 2/2010 | Funk et al. | |
| 2010/0036518 A1 | 2/2010 | Funk et al. | |
| 2010/0243604 A1 | 9/2010 | Lee et al. | |
| 2011/0039416 A1 | 2/2011 | Cole et al. | |

* cited by examiner

*Primary Examiner* — Stephanie Duclair
(74) *Attorney, Agent, or Firm* — Wood, Herron & Evans, LLP

(57) ABSTRACT

A surface wave plasma (SWP) source couples pulsed microwave (MW) energy into a processing chamber through, for example, a radial line slot antenna, to result in a low mean electron energy ($T_e$). To prevent impingement of the microwave energy onto the surface of a substrate when plasma density is low between pulses, an ICP source, such as a helical inductive source, a planar RF coil, or other inductively coupled source, is provided between the SWP source and the substrate to produce plasma that is opaque to microwave energy. The ICP source can also be pulsed in synchronism with the pulsing of the MW plasma in phase with the ramping up of the MW pulses. The ICP also adds an edge dense distribution of plasma to a generally chamber centric MW plasma to improve plasma uniformity.

13 Claims, 6 Drawing Sheets

LOW ELECTRON TEMPERATURE MICROWAVE SURFACE-WAVE PLASMA (SWP) PROCESSING METHOD AND APPARATUS

FIELD OF THE INVENTION

The invention relates to plasma processing with microwave (MW) plasmas, particularly surface wave plasmas (SWP), for example as produced with a radial line slot antenna, and more particularly, to a method and apparatus providing relatively low electron temperature and plasma uniformity

BACKGROUND OF THE INVENTION

Typically, during semiconductor processing, a plasma etch process, for example a dry plasma etch process, is utilized to remove or etch material along fine lines or within vias or contacts patterned on a semiconductor substrate. The plasma etch process generally involves positioning a semiconductor substrate with an overlying patterned, protective layer, for example a photoresist layer, into a processing chamber and etching exposed areas of the substrate through the pattern.

Once the substrate is positioned within the chamber, it is etched by introducing an ionizable, dissociative gas mixture into the chamber at a pre-specified flow rate, while throttling a vacuum pump to achieve a processing pressure. Then, plasma is formed when a portion of the gas species is ionized by collisions with energetic electrons. The heated electrons dissociate some of the gas species in the gas mixture to create reactant species suitable for the exposed surface etch chemistry. Once the plasma is formed, any exposed surfaces of the substrate are etched by the plasma. The process is adjusted to achieve optimal conditions, including an appropriate concentration of desirable reactant and ion populations to more selectively etch various desired features (e.g., trenches, vias, contacts, etc.) in the exposed regions of substrate. The exposed regions of the substrate where etching is required are typically formed of materials such as silicon dioxide ($SiO_2$), poly-silicon and silicon nitride, for example.

Conventionally, various techniques have been implemented for exciting a gas into plasma for the treatment of a substrate during such semiconductor device fabrication. In particular, capacitively coupled plasma (CCP) processing systems, such as parallel-plate systems, for example, or inductively coupled plasma (ICP) processing systems, have been utilized for plasma excitation. Among other types of plasma sources, there are microwave (MW) plasma sources, including those utilizing electron-cyclotron resonance (ECR), surface wave plasma (SWP) sources, and helicon plasma sources.

It is becoming common wisdom that SWP sources offer improved plasma processing performance, particularly for etching processes, over CCP systems, ICP systems and resonantly heated systems. This improved performance of SWP sources includes in general the production of a high degree of ionization at a relatively lower Boltzmann electron temperature ($T_e$). In addition, SWP sources generally produce plasma richer in electronically excited molecular species with reduced molecular dissociation. However, the practical implementation of SWP sources still suffers from several deficiencies including, for example, plasma stability and uniformity, and electron temperature that is still higher than preferred.

SUMMARY OF THE INVENTION

According to principles of the present invention, a surface wave plasma (SWP) source is provided that produces a high degree of ionization at substantially lower electron temperature than SWP sources of the prior art. According to further principles of the invention, the low electron temperature is provided with enhanced plasma uniformity.

According to certain embodiments of the present invention, a surface wave plasma (SWP) source is provided in which pulsed microwave energy is coupled into a processing chamber through, for example, a radial line slot antenna, to apply a less-than-full duty cycle that results in a low mean electron energy or low $T_e$. In the illustrated embodiments of the invention, microwave (MW) energy is pulsed to a SWP source to produce plasma with a relatively low average electron temperature.

In accordance with further principles of the present invention, in order to prevent impingement of the microwave energy onto the surface of the wafer when plasma density is low, such as between pulses of the microwave energy from the SWP, a secondary plasma source in the form of an ICP source, which can be, for example, a helical inductive source, a planar RF coil, or other inductively coupled source, is provided to produce a secondary plasma between the SWP source and the wafer that is opaque to microwave energy.

In the illustrated embodiment of the invention, the ICP source is pulsed in synchronized relationship with the pulsing of the microwave plasma to confine the duration of the ICP to the ramping up of the microwave energy at the beginning of the microwave pulses.

According to further principles of the invention, the ICP is combined with the SWP so as to introduce a ring-shaped distribution of energy to add an edge dense distribution of plasma to a generally chamber centric plasma produced by the SWP. As a result, improved plasma uniformity is provided. The relative energy delivered by the ICP and SWP sources provide a uniformity control parameter for the resulting plasma.

Also according to principles of the invention, the combined ICP and SWP source provides a source with a wide operating pressure range for plasma processing. In particular, the ICP extends the operating pressure range downward from that typical of the SWP source alone.

These and other objectives and advantages of the present invention are set forth in the following detailed description of the drawings in which:

DETAILED DESCRIPTION OF EXEMPLARY EMBODIMENTS

A microwave plasma processing method and apparatus are disclosed in various embodiments. However, one skilled in the relevant art will recognize that the various embodiments may be practiced without one or more of the specific details, or with alternative methods, materials, or components. Well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced with alternative specific details. Furthermore, the various embodiments shown in the figures are illustrative representations and are not necessarily drawn to scale.

References throughout this specification to "one embodiment" or "an embodiment" or "certain embodiments" or variations thereof means that a particular feature, structure, material, or characteristic described in connection with the embodiment is included in at least one embodiment of the invention, but do not denote that they are present in every embodiment. Thus, the appearances of the phrases such as "in one embodiment" or "in an embodiment" or "in certain embodiments" in various places throughout this specification are not necessarily referring to the same embodiment of the invention. Furthermore, the particular features, structures, materials, or characteristics may be combined in any suitable manner in one or more embodiments.

Nonetheless, it should be appreciated that, contained within the description are features which, notwithstanding the inventive nature of the general concepts being explained, are also of an inventive nature.

Figure 1:
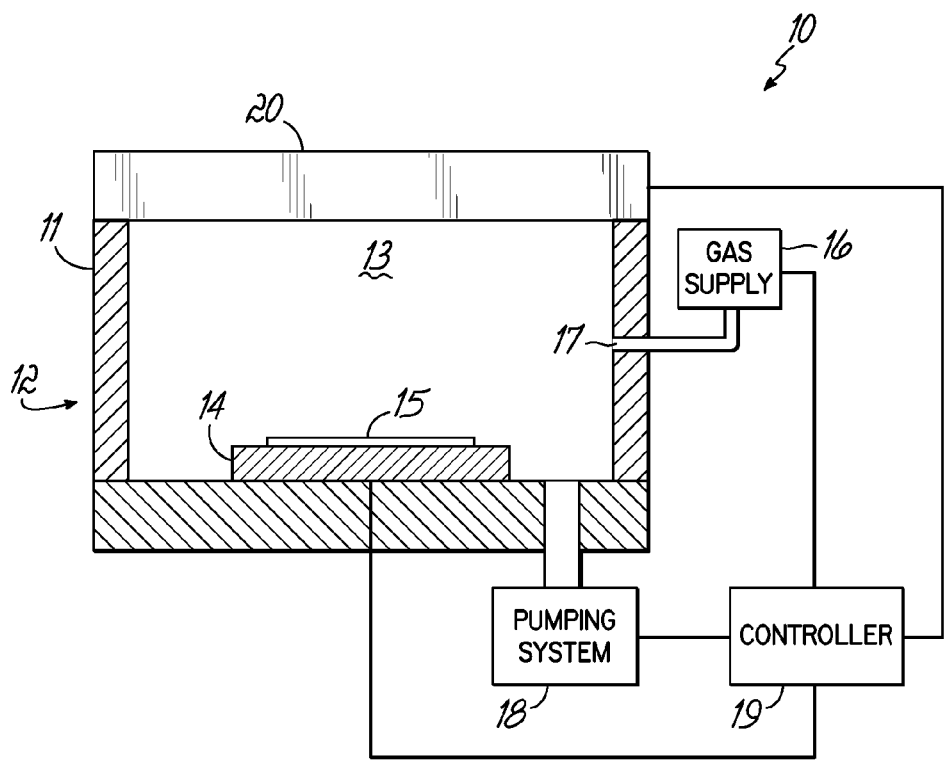
FIG. 1 is a simplified schematic representation of a plasma processing system according to an embodiment of the present invention.

Referring now to the drawings, wherein like reference numerals designate identical or corresponding parts throughout the several embodiments or several views, FIG. 1 illustrates a plasma processing system 10 according to certain embodiments of the invention. The plasma processing system 10 may be, for example, a dry plasma etching system or a plasma enhanced deposition system.

The plasma processing system 10 includes a processing chamber 12 having a chamber wall 11 configured to enclose a process space 13. The processing chamber 12 has therein a substrate holder 14 configured to support a substrate 15 in the process space 13. During operation of the system 10, the substrate 15 is exposed to plasma or process chemistry or both in process space 13. Furthermore, the processing chamber 12 has a plasma source 20 coupled to the processing chamber 12 and configured to energize a plasma in the process space 13. The plasma source 20 of the system 10 is a surface-wave plasma (SWP) source that may include a radial line slot antenna, to be discussed below.

As seen in FIG. 1, the plasma processing system 10 is provided with a gas supply system 16 that is configured to deliver process gas to the processing chamber 12 through a gas inlet port 17, which is coupled to the processing chamber 12 and configured to introduce a process gas to process space 13. In the illustrated embodiment, the system 10 may, for example, be configured to perform a dry plasma etching process on the substrate 15. During dry plasma etching, process gas from the gas supply system 16 typically includes an inert gas and may also include an etchant or a passivant, or a combination thereof. For example, when plasma etching is performed on a dielectric film on the wafer 15, such as, for example, a film of silicon oxide ($SiO_x$) or silicon nitride ($Si_xN_y$), the plasma etch gas composition generally includes an inert gas, fluorocarbon-based chemistry ($C_xF_y$) such as $C_4F_8$, $C_5F_8$, $C_3F_6$, $C_4F_6$, $CF_4$, etc., fluorohydrocarbon-based chemistry ($C_xH_yF_z$) such as of $CHF_3$, $CH_2F_2$, etc., oxygen, CO or $CO_2$, or a combination of these. Additionally, for example, when etching polycrystalline silicon (polysilicon), the plasma etch gas composition generally includes a halogen-containing gas such as HBr, $Cl_2$, $NF_3$, or $SF_6$ or a combination of thereof, fluorohydrocarbon-based chemistry, inert gas, oxygen, CO or $CO_2$, or a combination thereof. During plasma enhanced deposition, the process gas may include a film forming precursor, a reduction gas, an inert gas, or a combination thereof.

The plasma processing system 10 also includes a pumping system 18 that is coupled to the processing chamber 12 and configured to evacuate the processing chamber 12 and control the pressure within the processing chamber 12. Optionally, the plasma processing system 10 further includes a control system and electrical energy supply 19 coupled to the processing chamber 12, the substrate holder 14, the SWP plasma source 20, the gas supply system 16, and the pumping system 18. The control system 19 can be configured to execute a process recipe for performing an etch process or a deposition process or both on the wafer 15 in the plasma processing chamber 12.

Referring still to FIG. 1, the plasma processing system 10 may be configured to process 200 mm substrates, 300 mm substrates, or larger-sized substrates, and may be configured to process substrates, wafers or LCDs regardless of their size, as would be appreciated by those skilled in the art.

The processing chamber 12 is configured to facilitate the generation of plasma in process space 13 and introduce process chemistry in process space 13 adjacent a surface of the substrate 15. For example, in an etch process, the process gas can include molecular constituents that, when dissociated, are reactive with material being etched on the surface of the substrate 15. Once plasma is formed in the process space 13, heated electrons typically collide with molecules in the process gas causing dissociation and the formation of reactive radicals for performing an etch process, for example.

Figure 2:
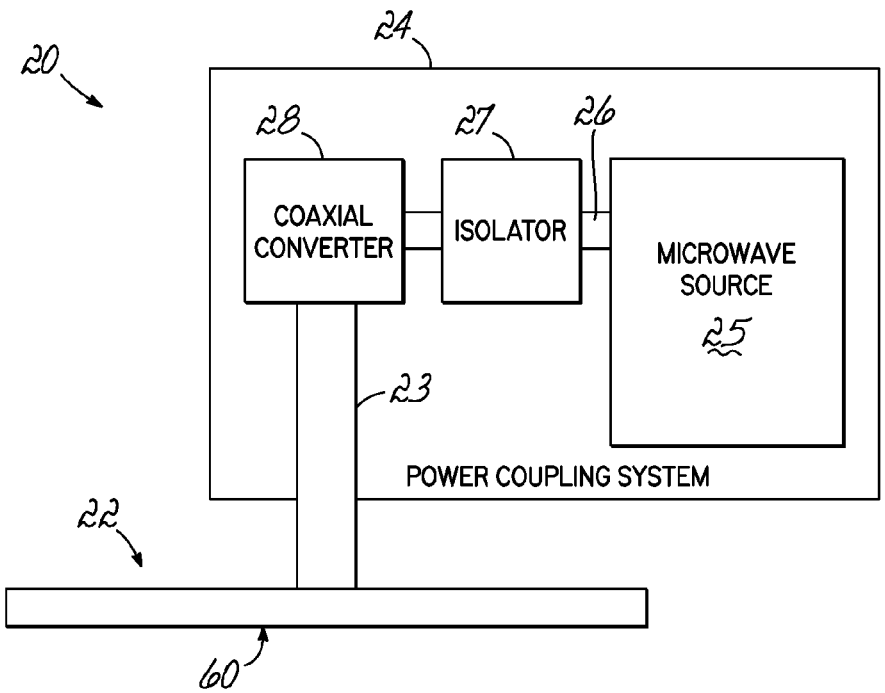
FIG. 2 is a simplified schematic representation of a surface wave plasma (SWP) source that can be used for the plasma processing system depicted in FIG. 1 in accordance with one embodiment of the present invention.

FIG. 2 is a schematic representation of the plasma source 20 that is in the form of a surface-wave plasma (SWP) source, according to certain embodiments of the invention. The SWP plasma source 20 comprises an electromagnetic (EM) wave launcher 22 configured to couple EM energy in a desired EM wave mode to a plasma in the process space 13 by generating a surface wave on a plasma surface 60 of the EM wave launcher 22. The SWP plasma source 20 comprises a power coupling system 24 coupled to the EM wave launcher 22, and configured to provide the EM energy to the EM wave launcher 22 for forming the plasma.

The EM wave launcher 22 includes a microwave launcher configured to radiate microwave power into process space 13 (FIG. 1). The EM wave launcher 22 is coupled to the power coupling system 24 via coaxial feed 23 through which microwave energy is transferred. The power coupling system 24 includes a microwave source 25, such as, for example, a 2.45 GHz microwave power source. Microwave energy generated by the microwave source 25 is guided through a waveguide 26 to an isolator 27 for absorbing microwave energy reflected back to the microwave source 25. Thereafter, the microwave energy is converted to a coaxial TEM (transverse electromagnetic) mode via a coaxial converter 28. A tuner may be employed for impedance matching, and improved power transfer. The microwave energy is coupled to the EM wave launcher 22 via the coaxial feed 23, wherein another mode change occurs from the TEM mode in the coaxial feed 23. An EM wave is launched from a plasma surface 60 of the EM wave launcher 22 into the process space 13 of FIG. 1. Additional details regarding the design of the coaxial feed 23 and the EM wave launcher 22 can be found in U.S. Pat. No. 5,024,716, entitled "Plasma processing apparatus for etching, ashing, and film-formation"; the content of which is herein incorporated by reference in its entirety.

Figure 3:
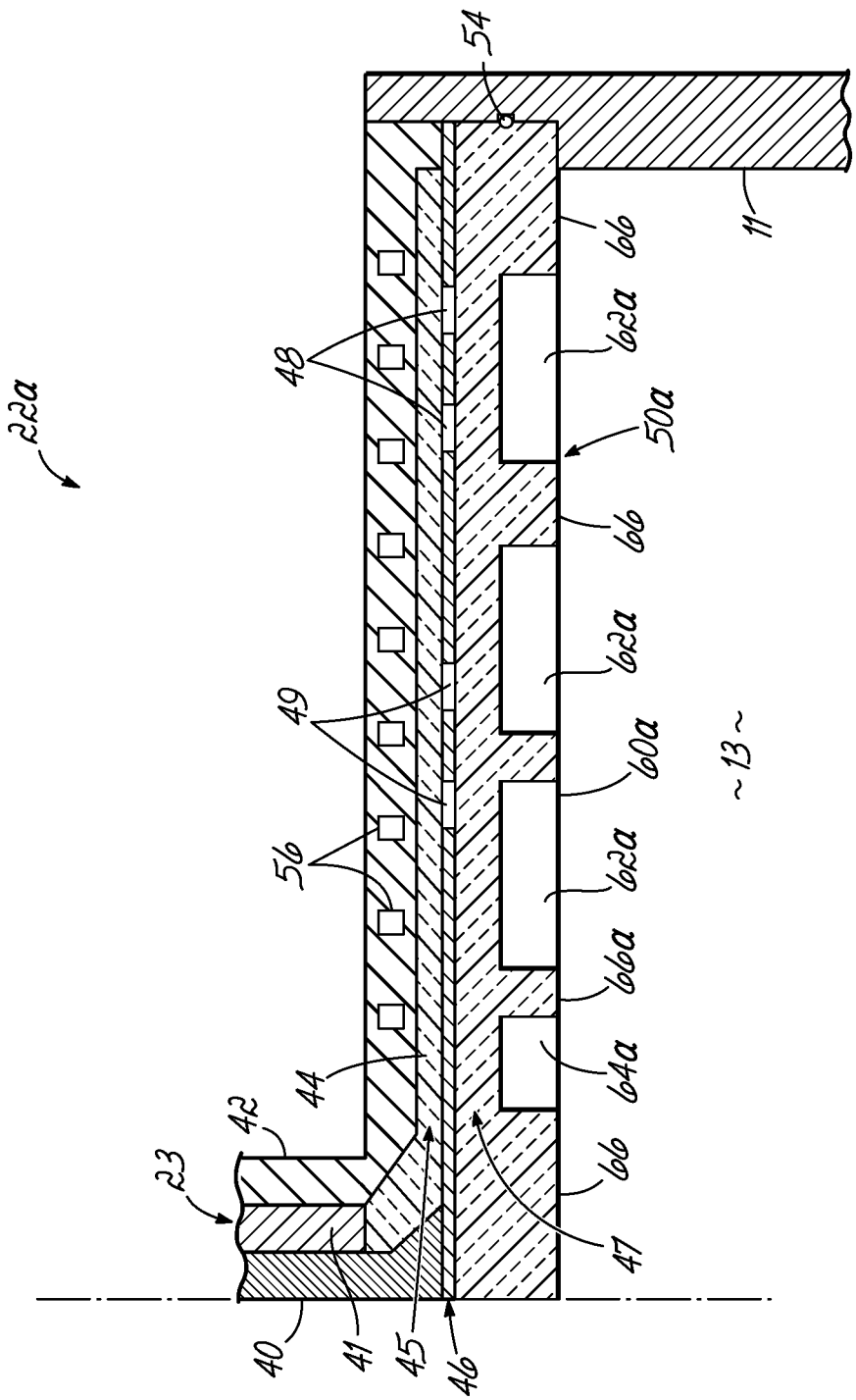
FIG. 3 is a schematic cross-sectional view of an electromagnetic (EM) wave launcher according to an embodiment of the SWP of FIG. 2.
Figure 4:
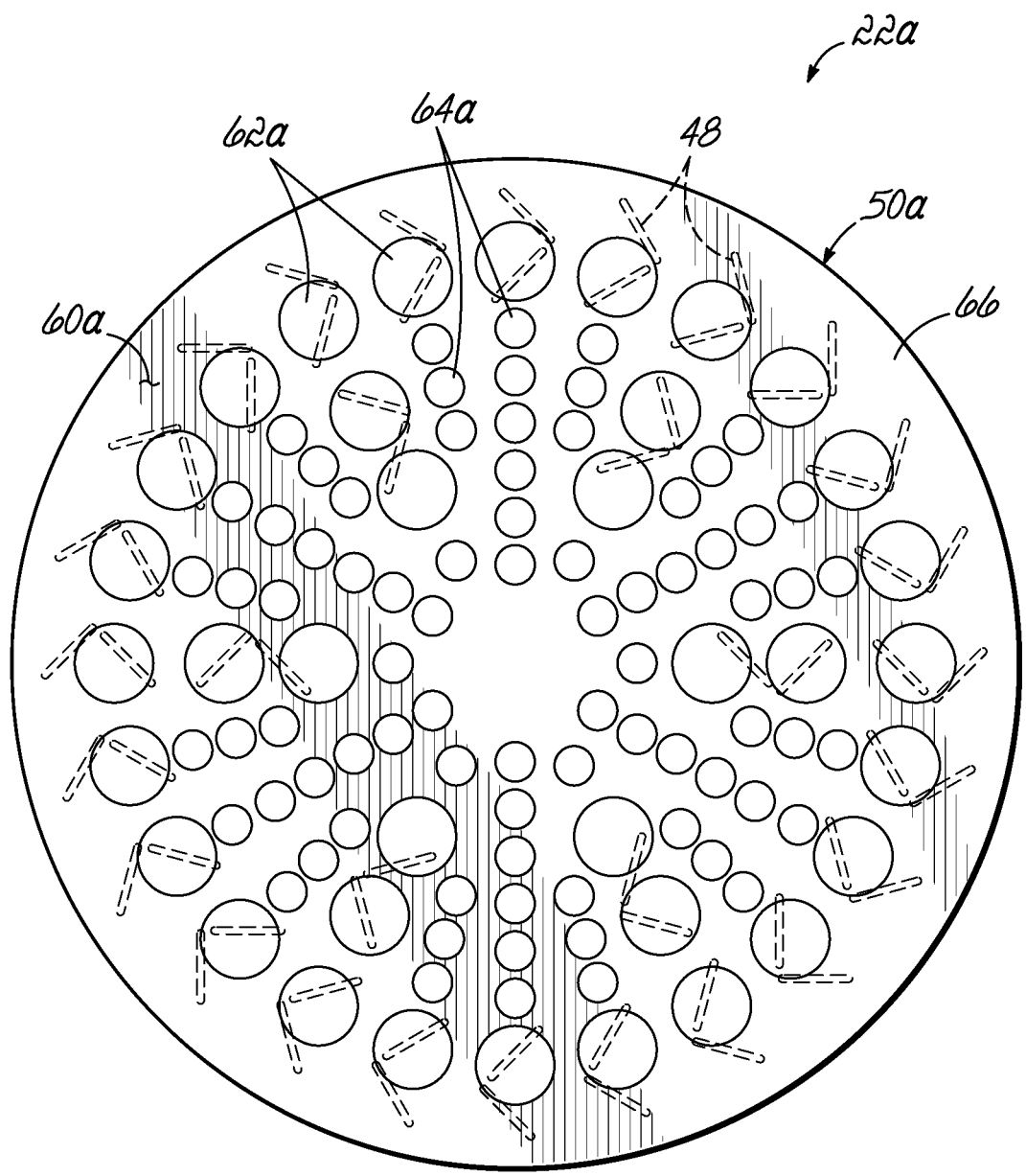
FIG. 4 provides a bottom view of the EM wave launcher depicted in FIG. 3.

FIGS. 3 and 4 are a schematic cross-sectional view and a bottom view, respectively, of one embodiment 22a of the EM wave launcher 22 of FIG. 2. The EM wave launcher 22a includes the coaxial feed 23 having an inner conductor 40, an outer conductor 42, and insulator 41, and a slot antenna 46. The slot antenna 46 has a plurality of slots 48 and a second plurality of slots 49 coupled between the inner conductor 40 and the outer conductor 42 as shown in FIG. 3. The pluralities of slots 48 and 49 permit the coupling of EM energy from a first region 45 above the slot antenna 46 to a second region 47 below the slot antenna 46. The EM wave launcher 22a may further comprise a slow wave plate 44, shown occupying the first region 45, and a resonator plate 50 (illustrated as an embodiment thereof 50a), shown occupying the second region 47. The resonator plate 50a has a plasma surface 60a facing the plasma that is formed in the process space 13.

The number, geometry, size, and distribution of the slots 48 and 49 are all factors that can contribute to the spatial uniformity of the plasma formed in process space 13 (see FIG. 1). Thus, the design of the slot antenna 46 may be used to control the spatial uniformity of the plasma in process space 13.

As further shown in FIG. 3, the EM wave launcher 22a may have a fluid channel 56 configured to flow a temperature control fluid for temperature control of the EM wave launcher 22a. Although not shown, the EM wave launcher 22a may further be configured with the gas inlet ports 17 (FIG. 1) therein to introduce process gas through the plasma surface 60a to the plasma in the process space 13.

Referring still to FIG. 3, the EM wave launcher 22a may be coupled to the chamber wall 11 of a plasma processing chamber 12, wherein a vacuum seal can be provided between the chamber wall 11 and the EM wave launcher 22a using a O-ring or other sealing device 54.

In general, the inner conductor 40 and the outer conductor 42 of the coaxial feed 23 are formed of a metal or other electrically conductive material, while the slow wave plate 44 and the resonator plate 50a can be formed of a dielectric material. The slow wave plate 44 and the resonator plate 50a preferably, but not necessarily, are formed of the same material. The material selected for fabrication of the slow wave plate 44 and the resonator plate 50a is chosen to reduce the wavelength of the propagating electromagnetic (EM) wave relative to the corresponding free-space wavelength, and the dimensions of the slow wave plate 44 and the resonator plate 50a are chosen to ensure the formation of a standing wave effective for radiating EM energy into process space 13.

The slow wave plate 44 and the resonator plate 50a may, for example, be fabricated from a silicon-containing material such as quartz (silicon dioxide), or a high-dielectric-constant (high-k) material. For example, the high-k material may have a dielectric constant greater than a value of 4. In particular, when the plasma processing system is utilized for an etch process, quartz is often chosen for compatibility with the etch process.

A high-k material may, for example, include intrinsic crystal silicon, alumina ceramic, aluminum nitride, and sapphire. Moreover, a particular high-k material may be selected in accordance with the parameters of a particular process. For example, when the resonator plate 50a is fabricated from intrinsic crystal silicon, the plasma frequency may exceed 2.45 GHz at a temperature of 45 degrees C. Therefore, intrinsic crystal silicon is appropriate for low temperature processes (i.e., less than 45 degrees C.). For higher temperature processes, the resonator plate 50a can be fabricated from alumina ($Al_2O_3$), or sapphire.

Plasma uniformity and plasma stability can be challenges for the practical implementation of a SWP source as described above. For example, plasma instability may result from a standing wave at the resonator plate-plasma interface, i.e., at the plasma surface 60a, that may be prone to mode jumps as plasma parameters shift. This can be controlled by shaping the plasma surface 60a of the resonator plate 50a as discussed in U.S. patent application Ser. No. 12/555,080, filed Sep. 8, 2009, hereby expressly incorporated by reference herein.

For example, as shown in FIGS. 3 and 4, the EM wave launcher 22a is fabricated with a first recess configuration 62a formed in the plasma surface embodiment 60a of the plasma surface 60 of FIG. 2, and a second recess configuration 64a formed in the plasma surface 60a. Recesses in the first recess configuration 62a may be of any of a number of shapes. The plasma surface 60a on resonator plate 50a may be a planar surface 66a within which the first recess configuration 62a and the second recess configuration 64a are formed. Alternatively, the resonator plate 50a comprises an arbitrary geometry. Therein, the plasma surface 60a may comprise a non-planar surface within which the first recess configuration and the second recess configuration are formed.

Figure 5:
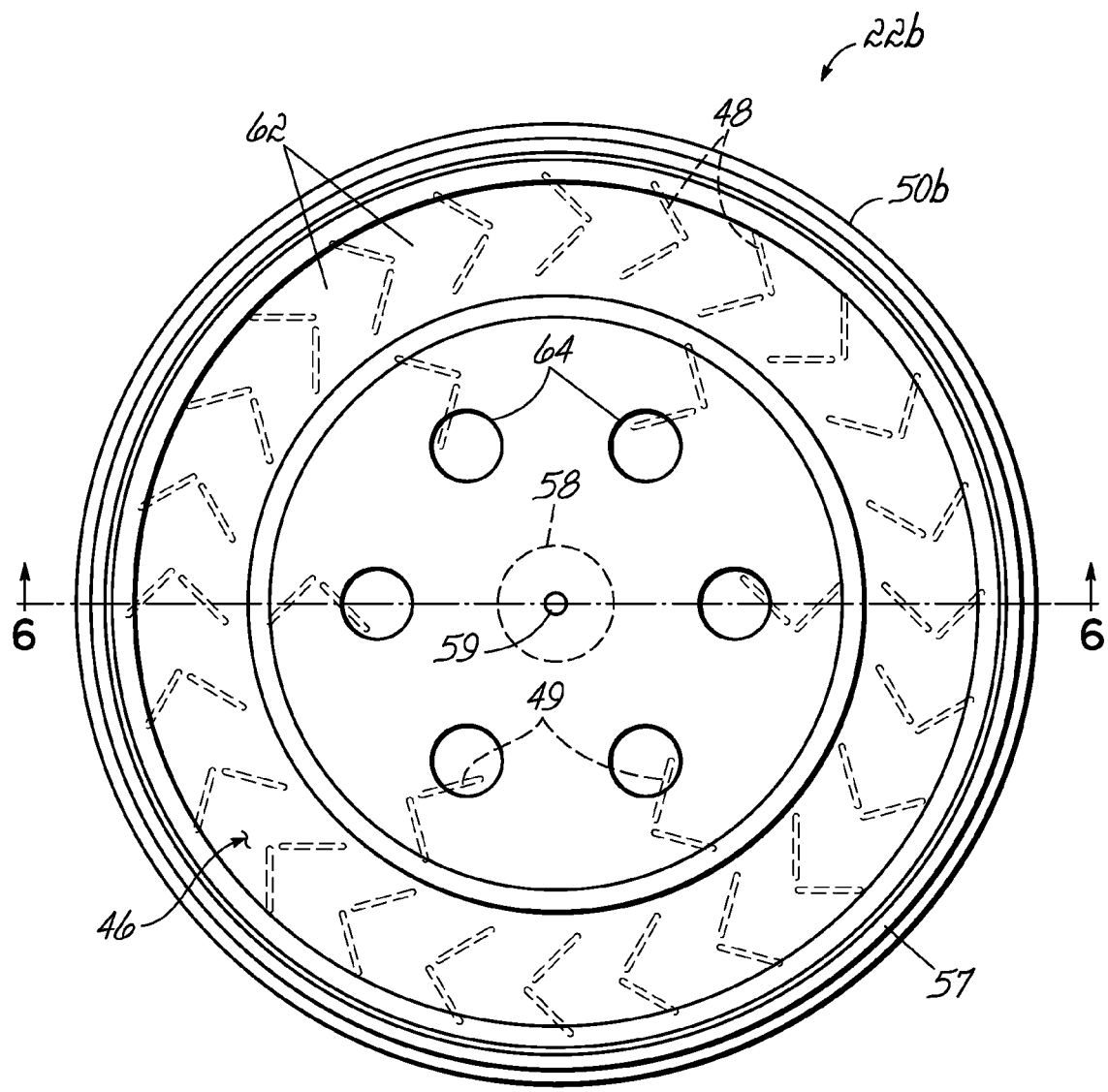
FIG. 5 provides a bottom view of one embodiment of the EM wave launcher depicted in FIG. 3.
Figure 6:
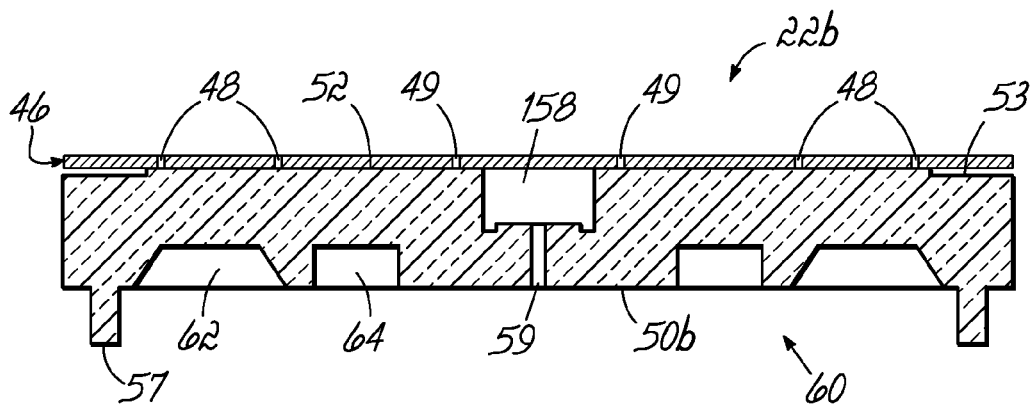
FIG. 6 is a schematic cross-sectional view of a portion of the EM wave launcher depicted in FIG. 4.

FIGS. 5 and 6 are a bottom view and a schematic cross-sectional view, respectively, of another embodiment 22b of the EM wave launcher 22 of FIG. 2. The EM wave launcher comprises an embodiment 50b of the resonator plate 50 with an embodiment 60b of the plasma surface 60. The EM wave launcher 22b further comprises slot antenna 46 having the first plurality of slots 48 and optionally the second plurality of slots 49. The first plurality of slots 48 and the second plurality of slots 49 permit the coupling of EM energy from a first region above the slot antenna to a second region below the slot antenna wherein the resonator plate 50b is located.

As shown in FIGS. 5 and 6, the EM wave launcher 22b is fabricated with a first recess configuration 62b formed in the plasma surface 60b and a second recess configuration 64b formed in the plasma surface 60b according to one embodiment.

The first recess configuration 62b may comprise a channel having a trapezoidal or frusto-triangular cross-section. However, the channel in the first recess configuration 62b may comprise an arbitrary geometry including, for example, a cylindrical geometry, a conical geometry, a frusto-conical geometry, a spherical geometry, an aspherical geometry, a rectangular geometry, a pyramidal geometry, or any arbitrary shape. The first recess configuration 62b may comprise a channel characterized by a first size (e.g., latitudinal dimension (or width), and/or longitudinal dimension (or depth)).

The second recess configuration 64b may comprise a plurality of recesses. Each recess in the second recess configuration 64b may comprise a unique indentation or dimple formed within the plasma surface 60b. For example, a recess in the second recess configuration 64b may comprise a cylindrical geometry (as shown), a conical geometry, a frusto-conical geometry, a spherical geometry, an aspherical geometry, a rectangular geometry, a pyramidal geometry, or any arbitrary shape. The second recess configuration 64b may comprise recesses characterized by a second size (e.g., latitudinal dimension (or width), and/or longitudinal dimension (or depth)). The first size of the channel in the first recess configuration 62b may or may not be the same as the second size of the recesses in the second recess configuration 64b. For instance, the second size may be smaller than the first size.

A recess in any one of the recess configurations described in the embodiment of FIGS. 3 and 4 may have any one of the cross-sectional shapes illustrated in FIGS. 5 and 6.

Additionally, as shown in FIGS. 5 and 6, the EM wave launcher 22b may be fabricated with a stepped mating surface having a first mating surface 52 and a second mating surface 53. The stepped mating surface may be configured to couple with the slot antenna. The EM wave launcher 22b may comprise an edge wall extension 57 located near a periphery of the resonator plate 50b and configured to couple with the process chamber wall. Furthermore, the EM wave launcher 22b may comprise an opening 58 and a gas passage 59. The opening 58 may be configured to receive fastening devices for securing a gas line through the inner conductor of the EM wave launcher 22b to the gas passage 59 in resonator plate 50b. Although only one gas passage is shown, additional gas passages may be fabricated in the resonator plate 50bF. Moreover, although the shape of the gas passage is straight having a cylindrical cross-section, it may be arbitrary, e.g., helical having an arbitrary cross-section. Any one or more of these features described in FIGS. 5 and 6 may be implemented in the embodiments described in FIGS. 3 and 4.

Using the design criteria set forth in the embodiments described in FIGS. 3 through 6, these embodiments and combinations thereof may be designed to produce stable, uniform plasma for a process window extending from pressures of from 0.1 mTorr to 20 Torr, and more particularly from 2 mTorr to 1 Torr. Powers may be from 0.1 kW to up to 15 kW, but more particularly from 0.5 kW to 5 kW. The electron temperature achieved at the substrate plane may be about 1 eV. The relatively smaller recesses may discharge more readily at relatively high pressure, while the relatively larger recesses may discharge more readily at relatively low pressure. Additionally, the relatively smaller recesses may absorb excess power when the relatively larger recesses saturate. In these configurations, the plasma discharge may stabilize while natural EM modes may lock and/or break up. Thus, a stable discharge may be observed near the EM wave launcher and uniform plasma properties may be observed near the substrate plane within the above identified process window.

Although not shown in the embodiments provided in FIGS. 3 through 6, one or more recesses in a recess configuration may be interconnected. Additionally, one or more recesses of one recess configuration may be interconnected with one or more recesses of another recess configuration. For example, one or more recesses may be interconnected or linked by a groove or channel.

The SWP plasma source 20 of the system 10 described above, particularly the microwave (MW) radial line slot antenna plasma source that employs the EM wave launcher 22 described in connection with FIGS. 3-6, produces a kind of diffusion plasma that can have quiescent low temperature plasma near the substrate processing region through a pure diffusion process. Achieving low mean electron energy, or low electron temperature ($T_e$) in the processing plasma has advantages of reducing wafer damage and producing more negative ions that can further alleviate the charge damage and electron shading effects.

Figure 7:
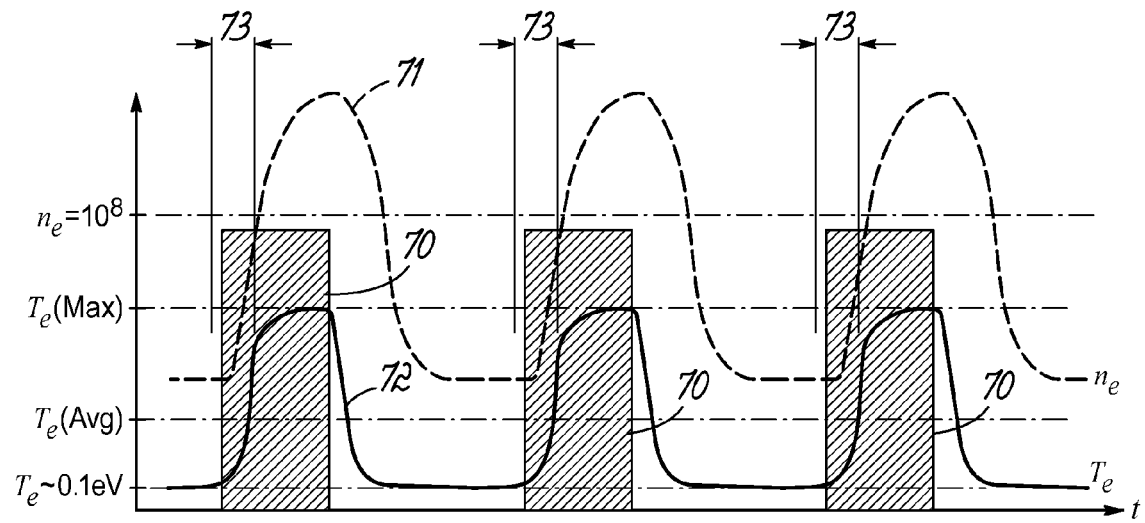
FIG. 7 is a graph representing one version of a pulsed microwave energy waveform applied to the EM wave launcher of FIG. 4, and the resulting plasma density.

According to certain aspects of the present invention, to further reduce the electron temperature in the wafer region and increase the negative ion population in the plasma, pulsing the MW energy to the radial line slot antenna is provided, as illustrated by the square wave pulses 70 in the graph of FIG. 7. Such pulsed MW energy delivered to the plasma produces a similarly fluctuating electron density or plasma density ($n_e$), illustrated by the curve 71, and corresponding electron temperature ($T_e$), as represented by the curve 72.

More specifically, the application of microwave energy from the EM wave launcher 22 causes the electron temperature ($T_e$) to rise from a background level of, for example, ~0.1 eV, to a maximum temperature ($T_e$) of, for example, $T_e$(Max), which would be the average electron temperature that would result when the MW energy is applied constantly. With MW energy applied in accordance with the pulsed waveform 70, the electron temperature ($T_e$) switches between a background temperature of ~0.1 eV and $T_e$(Max), resulting in an average electron temperature $T_e$(Avg), as illustrated in FIG. 7.

But while pulsing the MW to the plasma alone has the advantage of lowering electron temperature and increasing negative ion population near the substrate, it has the potential problem of producing a plasma that can become underdense during after-glow, following the energization pulses, while a continuously energized MW plasma would be generally opaque to the microwaves from the radial line slot antenna EM wave launcher 22. This opaqueness normally prevents microwave energy from directly impinging on the substrate 15 where it might damage the wafer. But when the plasma is pulsed, the plasma density drops after a MW pulse is extinguished, so that upon the start of the next pulse, while the plasma density is ramping up, it might be underdense, and the MW from the radial line slot antenna can then penetrate into bulk plasma and reach to substrate. Strong EM energy impinging on the wafer at the pulsing frequency can cause undesirable results during the performance of a real process on the wafer by interfering with the process, or can directly damage the structures on the wafer. Typically, when the plasma density ($n_e$) is less than $10^8$, the plasma is not sufficiently opaque to the MW energy to prevent these undesirable effects. As seen in FIG. 7, this occurs in the interval 73 at the beginning of each MW pulse.

Preventing the undesirable effects of an underdense plasma at the beginning of the MW pulses discussed in connection with FIG. 7 above, according to another aspect of the invention, is achieved by providing the features of the plasma processing system 80 illustrated in FIG. 8. The plasma processing system 80 includes processing chamber 12 having chamber wall 11 that encloses process space 13, with the processing chamber 12 containing the substrate holder 14 configured to support a substrate 15 in the process space 13. Plasma processing chamber 12 also has plasma source 20 at its top that is coupled to the processing chamber 12 to energize plasma in the process space 13, with the plasma source 20 being a surface wave plasma (SWP) source that may include a radial line slot antenna as described in connection with FIGS. 3-6 above.

Figure 8:
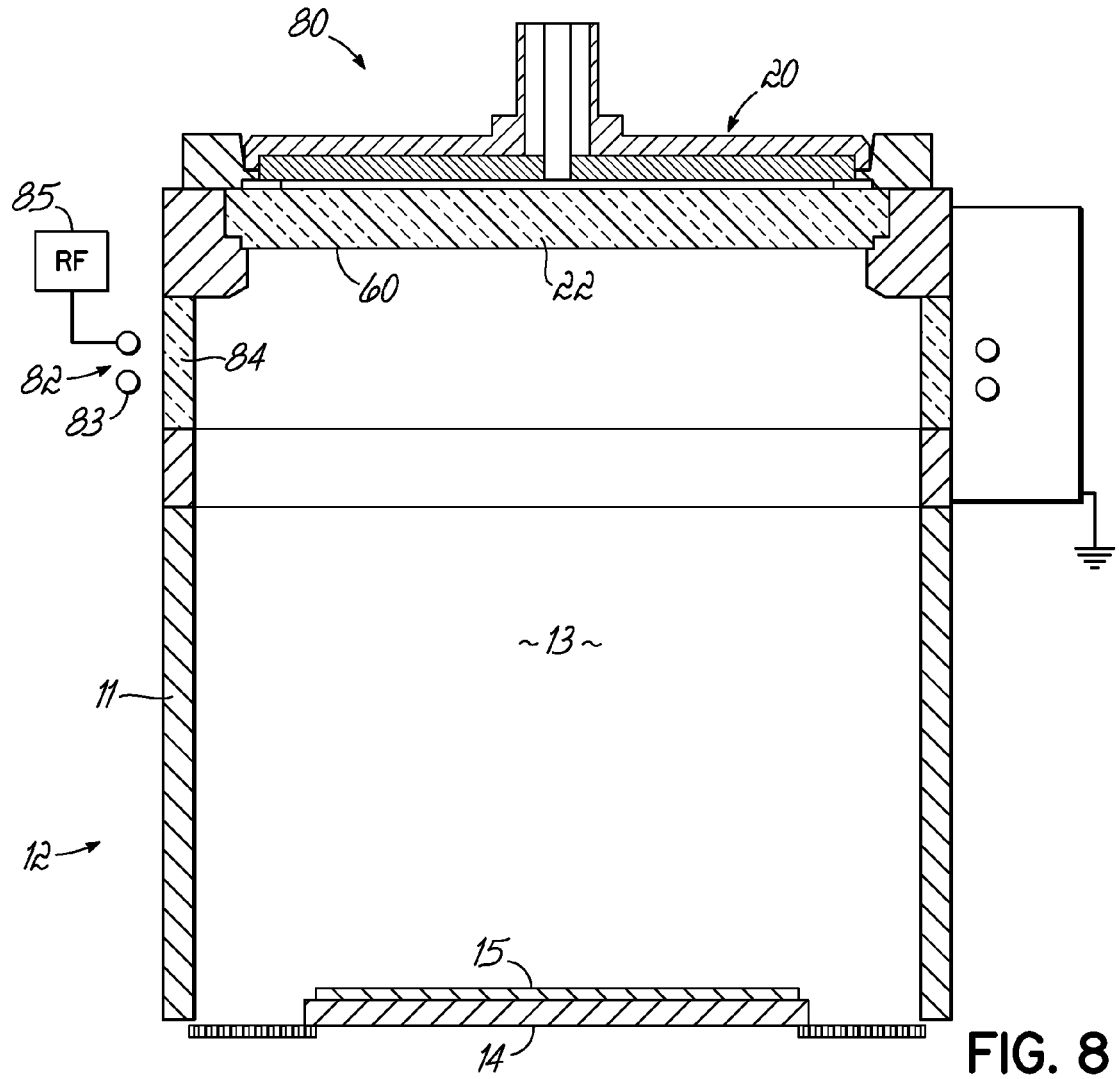
FIG. 8 is a is a simplified schematic representation, similar to FIG. 1, of a plasma processing system according to another embodiment of the present invention.

As seen in FIG. 8, the plasma processing system 80 may also be provided with gas supply system 16, gas inlet port 17, pumping system 18, and a control system 19 (not shown) such as described in connection with FIG. 1.

The plasma source 20 is a surface wave plasma (SWP) source, having an electromagnetic (EM) wave launcher 22 configured to couple EM energy to a plasma in the process space 13 by generating a surface wave on plasma surface 60, as described in connection with FIG. 2. The EM wave launcher 22 is coupled to the power coupling system 24 (FIG. 1) via coaxial feed 23 (not shown in FIG. 1) through which microwave energy is transferred.

But to enable pulsing a MW radial line slot antenna plasma source without encountering the underdense plasma situation during the ramping-up time of MW power-on period while still achieving a lower electron temperature plasma and higher negative ion population, a further aspect of the present invention employs an inductively coupled plasma (ICP) or a helical resonator source 82 in combination with the SWP plasma source 20. The ICP or helical resonator sources 82 includes a single turn or multi-turn coil(s) or a helical resonator antenna 83 that surrounds a dielectric window 84 at the top of the chamber wall 11 adjacent the SWP plasma source 20. An RF energy source 85 is coupled to the coils or helical resonator antenna 83. The RF energy source 85 is controlled to energize an ICP or a helical resonator source adjacent the EM wave launcher 22 that is sufficiently dense during the ramp-up of the microwave energy at the beginning of the MW pulses to render the plasma opaque to the microwaves during the interval 73 at the beginning of each MW pulse 70.

Figure 9:
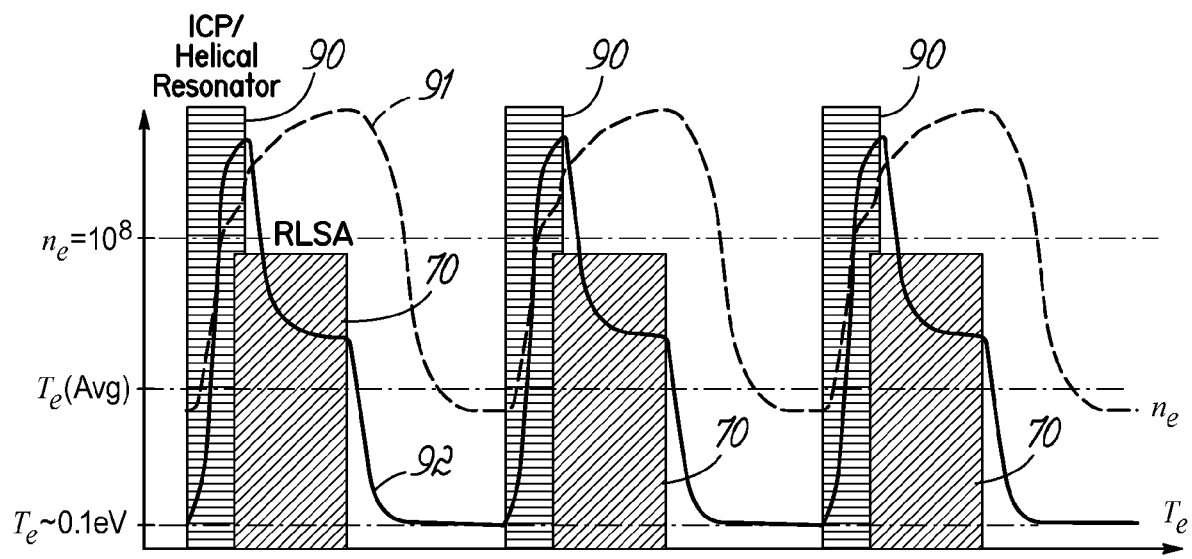
FIG. 9 is a graph, similar to FIG. 7, representing a version of a pulsed microwave energy waveform applied to the EM wave launcher and the RF energy applied to the ICP antenna of the system of FIG. 8, and the resulting plasma density.

More particularly, in order to avoid MW energy penetration into and through the bulk plasma that will reach the substrate during the start of each active-glow of pulsing MW radial line slot antenna, the RF energy to the ICP source or helical resonator source is pulsed in synchronism with the MW pulses 70, as shown by the ICP or helical resonator source pulses 90 in the graph of FIG. 9. These ICP or helical resonator source pulses 90 are applied at the same frequency as the MW pulses 70 and phased to lead the MW pulses. As a result, the plasma density ($n_e$) adjacent the EM wave launcher 22 rises to greater than $10^8$ prior to the ramping up of the MW pulses 70, as illustrated by the curve 91 in FIG. 9. This produces an electron temperature ($T_e$) as illustrated by the curve 92 in FIG. 9. That is, during the ramping-up time of the MW power-on period, ICP or Helical resonator pulsing brings the plasma density above the density needed to render the plasma opaque to MW radial line slot antenna plasma, which then blocks the MW wave from reaching the wafer surface of the wafer 15 during each MW pulse. Therefore, no underdense plasma situation is encountered when turning on the MW pulses. In this way, MW pulsing frequency is not critical and after-glow time can be extended, which enables the plasma to have very low ($T_e$) to thereby create a higher negative ion population at the wafer 15, and provide all other benefits associated with a low average electron temperature, as explained before.

Another issue associated with diffusion plasma such as a radial line slot antenna plasma or other SWP is that non uniform plasma density at the wafer region has a tendency to occur due to the nature of the diffusion process to concentrate plasma centrally in the chamber 12. The addition of the ICP or helical resonator sources 82, on the other hand, produces a plasma that tends to initially form in a ring shape adjacent the coil or helical resonator antenna 83 and dielectric window 84. The edge density can therefore be increased and modulated by the power and duty cycle of ICP/Helical resonator pulsing because the induced field from the coil or helical resonator antenna 83 is stronger at the edge of the chamber 12 and much weaker near the center. This adds to the MW plasma producing a plasma from the combined sources having enhanced uniformity. Hence, the ICP or helical resonator source provides an adjustable uniformity control knob for the diffusion MW plasma to achieve a uniform plasma density near wafer surface.

For example, the RF coil or helical resonator antenna 83 in FIG. 9, when added near the side wall of a plasma source, such as an MW RLSA or other SWP source, either externally or internally, can effectively ionize the edge neutral gas and increase the edge plasma density. Meanwhile, the edge radical density and neutral dissociation degree can be also increased by effective dissociation that is induced by the inductive coil or helical resonator antenna due to its electron energy distribution function.

In addition, the added RF inductive coil or helical resonator antenna and power, preferably ranging from 0.5 to 5 kW associated with it, can extend MW SWP to plasma processes at very low pressure, such as less than 10 mT. This is because the energy coupled from an RLSA and an ICP or helical resonator into the plasma, prefers different pressure regions. RLSA can operate more effectively at relatively high pressure but is difficult to discharge at very low pressure. ICP, on the other hand, can easily operate at very low pressure but not very easily at high pressure. Extending the operational pressure window is desired in plasma processing for controlling e.g. etch profiles, thin film deposition rates, and other performance parameters. The combination of RLSA and ICP/Helical resonator plasma would extend the operating pressure window from 0.5 mT up to about 20 Torr, for example, which has been impossible for either RLSA or ICP alone.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method of maintaining a low electron temperature plasma in the vacuum processing of a substrate, comprising:
    supporting a substrate for processing at one end of a vacuum processing chamber with a surface thereof facing a processing volume in the chamber;
    coupling microwave energy into the processing space within the chamber from a surface wave launcher at an end of the chamber opposite the substrate;
    pulsing the microwave energy to the surface wave launcher for coupling a pulsed waveform of the microwave energy into the processing space;
    pulsing inductively coupled radio frequency (RF) energy in synchronism with the pulsing of the microwave energy so that an inductively coupled plasma is present in the processing space at a beginning of each pulse of the pulsed microwave energy; and
    controlling the pulsing of the microwave energy and the inductively coupled RF energy to produce in the processing space the inductively coupled plasma having an electron temperature at or below a maximum electron temperature that the microwave energy would produce in the processing space absent the pulsing and is of sufficient density to prevent microwave energy penetration of the substrate.

2. The method of claim 1 wherein:
    the microwave energy is coupled into the processing space from a radial line slotted antenna of the surface wave launcher or from any microwave surface wave coupling mechanism.

3. The method of claim 1 further comprising:
    inductively coupling RF energy into the chamber around an edge of the surface wave launcher such that the inductively coupled plasma is present in the processing space adjacent the surface wave launcher at the beginning of each pulse of the pulsed microwave energy.

4. The method of claim 3 wherein:
the microwave energy is coupled into the processing space from a radial line slot antenna of the surface wave launcher.

5. The method of claim 3 further comprising:
increasing a density of the plasma in the processing space during an after-glow of each pulse of microwave energy with each pulse of inductively coupled RF energy synchronized at the beginning of each pulse of the pulsed microwave energy to prevent a damaging amount of the pulsed microwave energy from penetrating the processing volume and impinging on the substrate.

6. The method of claim 1 wherein:
the microwave energy is coupled into the processing space from a radial line slot antenna of the surface wave launcher.

7. A plasma processing apparatus comprising the vacuum processing chamber having a substrate support therein at one end thereof, a surface wave launcher at an end of the chamber opposite the substrate support, a microwave energy source coupled to the surface wave launcher, an inductive coil around the chamber at the edge of the surface wave launcher, an RF generator coupled to the coil, and a controller programmed to control the microwave energy and the RF energy to operate the apparatus according to the method of claim 1.

8. The apparatus of claim 7 wherein:
the surface wave launcher includes a radial line slot antenna.

9. A plasma processing apparatus comprising the vacuum processing chamber having a substrate support therein at one end thereof, a surface wave launcher at an end of the chamber opposite the wafer support, a microwave energy source coupled to the surface wave launcher, an inductive coil around the chamber at the edge of the surface wave launcher, an RF generator coupled to the coil, and a controller programmed to control the microwave energy and the RF energy to operate the apparatus according to the method of claim 3.

10. The plasma processing apparatus of claim 9 wherein the inductive coil is a helical resonator antenna.

11. The apparatus of claim 9 wherein:
the surface wave launcher includes a radial line slot antenna.

12. A plasma processing apparatus comprising the vacuum processing chamber having a substrate support therein at one end thereof, a surface wave launcher at an end of the chamber opposite the substrate support, a microwave energy source coupled to the surface wave launcher, and a controller programmed to control the microwave energy to operate the apparatus according to the method of claim 1.

13. The apparatus of claim 12 wherein:
the surface wave launcher includes a radial line slot antenna.

* * * * *

UNITED STATES PATENT AND TRADEMARK OFFICE
CERTIFICATE OF CORRECTION

PATENT NO. : 8,968,588 B2  
APPLICATION NO. : 13/436458  
DATED : March 3, 2015  
INVENTOR(S) : Jianping Zhao et al.

Page 1 of 1

It is certified that error appears in the above-identified patent and that said Letters Patent is hereby corrected as shown below:

On the title page at (73) Assignee: "Tokyo Electron Limited, Tokyo (JP)" should read --Tokyo Electron Limited, Tokyo (JP); University of Houston System, Houston, TX (US)--.

Signed and Sealed this  
Twenty-ninth Day of September, 2015

Michelle K. Lee  
*Director of the United States Patent and Trademark Office*